United States Patent [19]

Moreau

[11] 4,103,181
[45] Jul. 25, 1978

[54] MONOLITHIC INTEGRATED TRANSISTOR AND PROTECTIVE CIRCUIT THEREFOR

[75] Inventor: Jean Michel Moreau, Paris, France
[73] Assignee: Thomson-CSF, Paris, France
[21] Appl. No.: 710,880
[22] Filed: Aug. 2, 1976
[30] Foreign Application Priority Data
  Aug. 5, 1975 [FR] France ................. 75 24427
[51] Int. Cl.² .......................................... H03K 17/00
[52] U.S. Cl. .............................. 361/86; 307/296 A; 307/304
[58] Field of Search ..................... 357/51; 361/60, 392, 361/395, 397; 307/303, 200 A, 200 B; 330/207 P

[56] References Cited
U.S. PATENT DOCUMENTS

| | | | |
|---|---|---|---|
| 3,300,658 | 1/1967 | Slusher et al. | 307/303 |
| 3,562,547 | 2/1971 | Brodie | 351/51 |
| 3,573,573 | 4/1971 | Moore | 307/303 |
| 3,654,530 | 4/1972 | Lloyd | 357/51 |

Primary Examiner—Stanley D. Miller, Jr.
Assistant Examiner—B. P. Davis
Attorney, Agent, or Firm—Cushman, Darby & Cushman

[57] ABSTRACT

A protective device for, and a monolithic integrated transistor formed on a semi-conductor substrate of at least first conductivity type and having a first collector region of opposite conductivity type on the substrate, a buried region of opposite conductivity type and slight resistance between the substrate and collector regions, a base region of the first conductivity type formed on the collector region, an emitter region of the opposite conductivity type formed on the base region, the buried region being connected to the surface at the collector terminal and at a separate terminal. The voltage between the collector and separate terminals is compared with a reference in a differential circuit and a control signal produced to control the base voltage of the integrated transistor, and accordingly to protect the integrated transistor.

9 Claims, 5 Drawing Figures

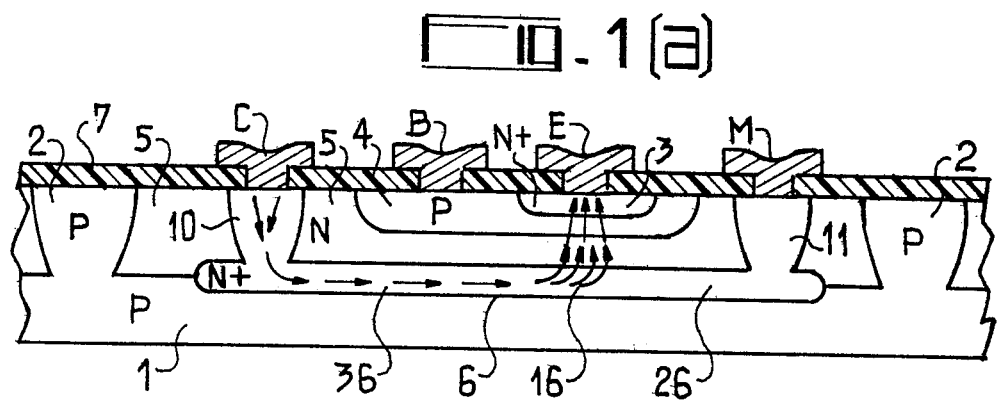
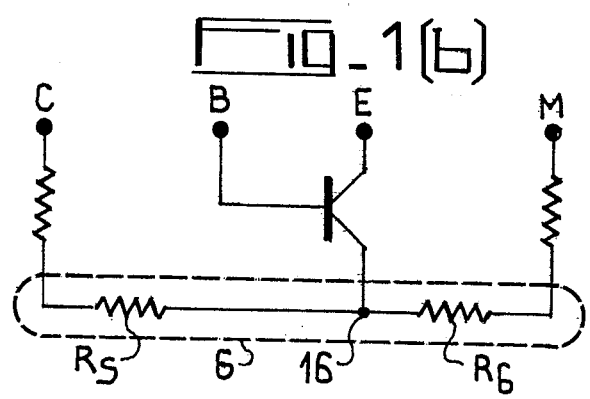
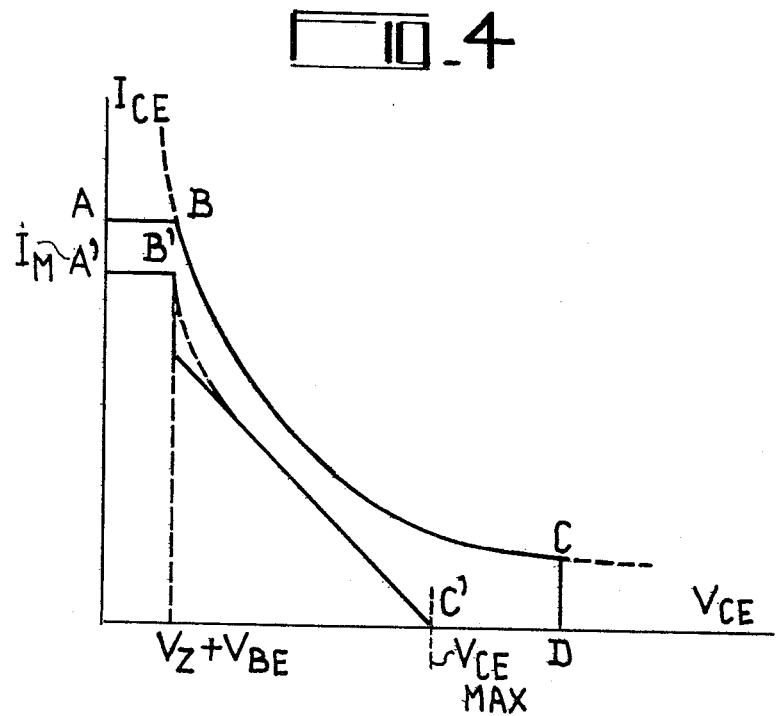

MONOLITHIC INTEGRATED TRANSISTOR AND PROTECTIVE CIRCUIT THEREFOR

The present invention relates to a device for protecting electrical circuits which device is made up of semiconductive elements and, particularly for devices which connect, in complex circuits on common conductive unit, a great number of active components, particularly transistors or diodes, formed as monolithic integrated circuits.

It is well-known, in a general way, that a transistor can be used only within the limits of a given range of voltages and currents beyond which the destruction of the transistor is likely. This destruction is caused by: (1) overvoltages; (2) degradation of an emitter-base or base-collector junction; or (3) excess currents melting the connecting wires or the metallized conductive layers which assure its function.

More precisely, when a transistor is used under normal operating conditions, namely with its base-emitter junction not polarized in reverse conduction, and its collector-base junction polarized in reverse conduction, destruction can occur under essentially three circumstances:

(1) when the voltage between the collector and emitter exceeds a certain value a phenomenon known as primary avalanche then occurs in the semiconductor;

(2) when, simultaneously, the collector current and the emitter-collector voltage exceed two particular associated values; the destructive phenomenon noted is designated as secondary avalanche; and (3) finally, as already indicated above, failure can occur from excess currents in the connections of the emitter and collector, which destroy the latter by melting.

These various risks of destruction can be avoided by severely reducing the voltage and current intervals applied to the transistor in service. However, this reduction permits only a very partial exploitation of the possibilities of such an active component.

It is possible to graphically represent the safe operating conditions in an area, known as a "safety area", on a rectangular Cartesian coordinate system, with the collector-emitter voltages plotted on the abscissas and the collector currents on the ordinates. With such a representation, it is possible without risk to extend considerably the choice of operating conditions provided they are chosen according to the values whose representative point is located inside this area. A more detailed discussion of this diagram, applied to the present invention follows.

It has already been proposed, in the known art, to remedy these risks of destruction by suitable protective circuits made up of separate components associated with the transistor. For example, means have been proposed for limiting the emitter or collector current to a given maximum value by limiting the base current to a related given value. It has also been proposed to measure, by means of a slight resistance placed in series with the emitter or collector, the current that passes through one of these electrodes and to control in accordance therewith the base current to maintain the voltage drop in the resistance below a given maximum value.

It should be noted that, while these arrangements are effective against the third harmful phenomenon indicated above, they are not effective against the second, except for emitter-collector voltage values below a certain maximum limit, and, finally, they are not effective at all against the first phenomenon, i.e., a collector-emitter overvoltage.

Further, a protective circuit has been proposed that prevents the emitter or collector maximum current from exceeding a limiting value that decreases as the collector-emitter voltage increases.

Most of the circuits of the known art thus generally comprise at least a resistance connected in series with an emitter or collector electrode and intended to measure the current flowing through the corresponding terminal.

The use of such circuits is possible in embodiments with separate or "discrete" components, but very difficult with monolithic integrated circuits. Realization of the resistance necessary for using the protective circuit, considering the requirements on its value, entails notable complications, and, at times, practical impossibilities.

This resistance should be small, typically of the order of one ohm. Since it is intended solely for measuring, it should cause only a minimal voltage drop; with the techniques customary in making integrated resistances, such resistance is very bulky. On the other hand, inserted in a high-current electrode, the resistance should be capable of a considerable heat dissipation; known techniques make good heat sinking of this resistance difficult.

The protective device which is the object of the present invention does not have these drawbacks. In certain parts of semiconductive elements having transistors made with monolithic integration there are regions in contact with certain electrodes of these transistors, regions created for collector contact connection. These regions can also be used to measure resistance. In integrated circuits, this connection is usually made in the form of a semiconductor layer with low resistivity which is placed in the semiconductive wafer common to all the integrated components, and which presents one or more terminals for outside connection of the collector to the upper outside surface of the wafer. For simplification, this layer will be designated throughout the following description as the "buried layer".

In principle, the invention of this application, therefore, provides for the use of the internal connection of the collector for two simultaneous functions, i.e., that of a connection with low resistivity and that of protective resistance. In this second function, it is associated with an operating circuit of the voltage created at its terminals, this combination protecting continuously, on the one hand, against primary avalanche, the control of the base-emitter voltage against the value of the collector-emitter voltage, and, on the other hand, against secondary avalanche, the control of the collector-emitter current and voltage.

More precisely, the invention relates to a transistor protective device, and particularly for a monolithic integrated circuit transistor. This transistor is created on a main face of a semiconductive substrate of a first type of conductivity, and has a first collector region formed in the substrate, of a second type of conductivity opposite to the first, a second base region of the first type of conductivity formed on the collector region, a third emitter region of the second type of conductivity formed on the base region and a fourth region, of low resistivity, in buried layer form, and of the second type of conductivity, placed between the collector region and the substrate. In combination with this transistor, means is provided for electric connection with at least two separated points of the buried layer, means for comparing the electric voltage between these two points, and means for controlling the base in accordance therewith to limit the base current as a function of the collector voltage.

The invention will be better understood with the aid of the following description, with reference to the accompanying Figures, in which:

FIGS. 1(a) and (b) represent, in section, a transistor that is part of an integrated circuit, and a schematic depiction of the protective device;

FIG. 4 represents an explanatory diagram.

Figure 2:
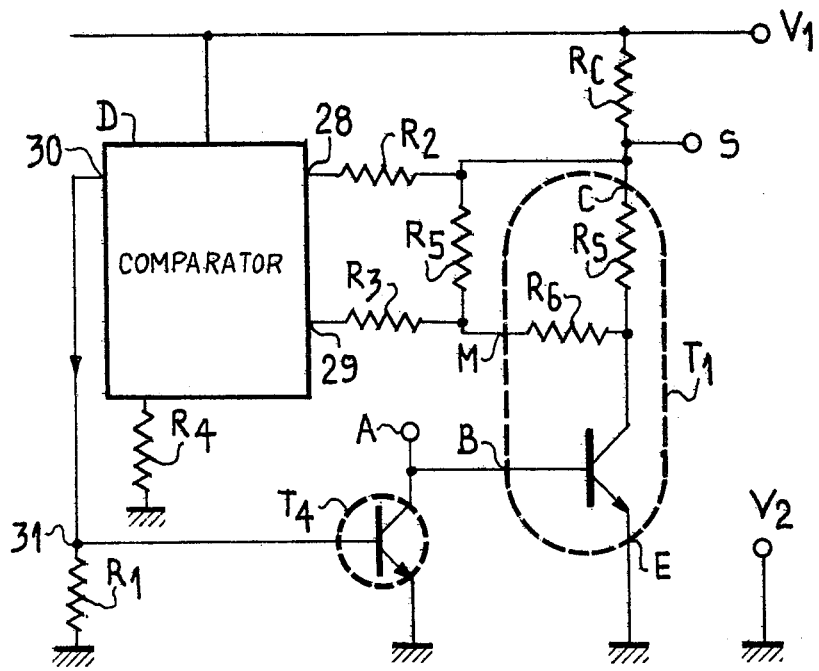
FIG. 2 represents an embodiment of the device according to the present invention.

FIG. 1 represents, in section, a transistor of the planar type, made for incorporation into an integrated circuit. In a common substrate 1, of semiconductive material such as silicon, of p type conductivity, for example, a certain number of transistors are made, such as the one represented in FIG. 1(a). Each has an emitter region 3, of $n^{30}$ conductivity, with its contact terminal E, a base region 4, of $p$ conductivity with its contact terminal B, and a collector region 5, of $n$ conductivity. The individual transistors are insulated from one another and this insulation is achieved by surrounding collector 5 with polarized rectifying junctions with back voltage in the semiconductive unit. Each insulation is formed, on its sides or walls, by regions 2 of $p$ conductivity, in relation to the collector of $n$ conductivity, and on the bottom by substrate 1.

To lower the resistance of the collector contact connection a "buried layer" of semiconductive material with low resistivity 6 and of $n^+$ conductivity is placed between the collector and substrate. Collector contact C is connected to this layer, by means of a well 10 with low resistivity during operation, the collector current follows the paths indicated by the arrows; the collector-emitter current travels principally low in the buried layer with low resistivity, and leaves it only in zone 16 which is opposite the emitter contact E.

According to one aspect of the present invention, the buried layer, already present in the transistor to assure a conduction function, is used for a second function, i.e., that of measuring resistance of the collector current path.

However, to measure the ohmic drop of the voltage in the buried layer, it must be possible to connect the measuring circuit directly at two distinct points of the layer. This connection is impossible in the case of a usual transistor, for at least one of the two necessary points, since it would require a connection directly to the emitter E, i.e., through the transistor itself. Therefore, it is essential to provide the transistor with a second contact to the buried layer, represented as M in FIG. 1, connected to this layer by well 11. Since the resistance of the portion of the buried layer and well 1 is low, it is thus possible, with a measurement circuit having a low power consumption connected between contacts C and M, to measure the drop of ohmic voltage between contact C and point 16 of the buried layer without disturbing the separation of the currents and the functioning of the transistor. FIG. 1(b) represents, in schematic form, the equivalent circuit of the transistor for the monolithic integration of FIG. 1(a). The buried layer is shown by the broken-line contour 6, and part 36 of the buried layer, between contact C and point 16, is represented by resistance $R_s$. Part 26 between point 16 and contact M is represented by resistance $R_6$.

FIG. 2 represents a diagram of the protective device which is the object of the invention. This device comprises transistor $T_1$, to be protected, delimited by the broken-line contour, including in its interior, resistance $R_s$ in series in the transistor collector and resistance $R_6$ whose natures and functions are indicated above. Transistor $T_1$ comprises an input A for the signal to be amplified, and an output S for the amplified signal, collected at the terminal of collector C to which current is supplied by resistance $R_c$. The other connecting terminals of transistor $T_1$ are respectively those of emitter E, base B, and measurement contact M. An electric power source (not shown) is connected to its terminals, and connected to terminals $V_1$ and $V_2$ for which terminal $V_2$ is selected as the ground.

The operating circuit of the voltage produced in resistance $R_s$ by the collector current is connected at terminals M and C to resistance $R_5$, which constitutes a divider bridge with resistance $R_6$. The operating circuit consists of a differential circuit D fed through resistances $R_2$ and $R_3$, whose function is to create, at its output terminal 30, which is connected by resistance $R_1$ to terminal $V_2$ of the source, an electrical signal proportional to the voltage difference at its inputs 28 and 29. The reference voltage necessary to establish the origin of the differences is provided by resistance $R_4$. This signal is applied to the base of an amplifying transistor $T_4$ whose collector output is coupled to the base B of transistor $T_1$ which is to be protected.

In operation, the voltage created at output 30 of the differential circuit which is related, as explained above, to the value of the collector current and the collector-emitter voltage of the transistor to be protected, determines, depending on the conditions established by the relative adjustment of resistances $R_1$ and $R_4$, the voltage at the base of transistor $T_4$.

Depending on its conduction level, transistor $T_4$ will thus absorb all or part of the base current feeding the base of transistor $T_1$ to be protected, by connecting base B to ground $V_2$ by a low impedance. Therefore, transistor $T_1$ will support, between collector and emitter, a much greater voltage before primary avalanche. Also, when the collector-emitter voltage diminishes, the maximum collector-emitter current passing through transistor $T_1$ increase, its rate of increase still being determined by the relative values of resistances $R_1$ and $R_4$.

Figure 3:
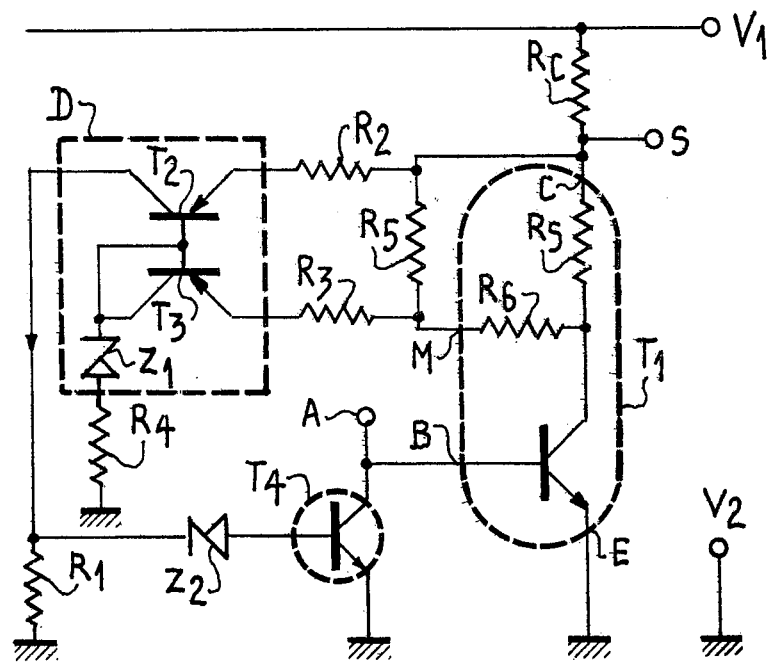
FIG. 3 represents a variant of the embodiment of FIG. 2.

FIG. 3 represents a preferred second embodiment of the device according to the invention. According to this second embodiment, the differential circuit is formed with two transistors $T_2$ and $T_3$, and a stabilizing diode $Z_1$ of the Zener type, in series with resistance $R_4$. A second stabilizing diode $Z_2$ is inserted in series with base of transistor $T_4$. The pressure of the two Zener diodes improves the connection between the two operating conditions already indicated, namely, the operating conditions of high collector-emitter voltage and blocked base (primary avalanche) and the operating conditions of slight collector-emitter voltage and large collector current (secondary avalanche). Diode $Z_2$ defines the operating threshold of transistor $T_4$ with precision.

The operation of the protective device made according to the second embodiment is described below with reference to FIG. 4, with the following hypotheses:

(1) the base-emitter voltages of transistors $T_2$, $T_3$ and $T_4$ indicated as $V_{BE2}$ and $V_{BE3}$ and $V_{BE4}$, are equal and constant;
(2) the base currents of $T_2$ and $T_3$ are negligible;
(3) Zener diodes $Z_1$ and $Z_2$ have Zener voltages $V_{Z1}$, $V_{Z2}$, identical and equal to $V_Z$;
(4) resistance $R_s$ is slight with regard to $R_5$ and $R_6$, and resistances $R_3$, $R_5$ and $R_6$ are slight in regard to $R_4$.

It can then be shown that, under these conditions, the safety device functions by controlling the base voltage of $T_4$, when the following relation is satisfied:

$$V_{CE1}\frac{R_1}{R_4} + I_{C1}R_s\frac{R_5}{R_5+R_6} \frac{R_1}{R_2} = \qquad (1)$$

$$(V_Z + V_{BE})(1 + \frac{R_1}{R_4})$$

Hence the three following cases:

For $V_{CE1}$ greater than or equal to $(V_Z + V_{BE})(1 + R_4/R_1)$, transistor $T_4$ absorbs all the available current to the base of $T_1$. Transistor $T_1$ can support without damage a high voltage between collector and emitter; and is very effectively protected against primary avalanche.

When $V_{CE1}$ is lower than $(V_Z + V_{BE})(1 + R_4/R_1)$, the maximum permitted current increases linearly when $V_{CE1}$ decreases. By a suitable selection of values of relation (1), it is possible to operate very close to the limits imposed by the safety area indicated above, as long as $V_{CE1}$ still remains greater than $V_Z + V_{BE}$.

Finally, when $V_{CE1}$ becomes less than this value, transistor $T_4$ cannot receive any current in its base; it stops operating and the circuit no longer gives protection from excess collector currents. However, destruction of the connections in this third case can be avoided by selecting for the source that feeds the base of $T_1$ a type known in the art as a "constant current source", which will thus assure limitation of the collector current to a value at most equal to that meeting the conditions of the safety area diagram.

It should be noted that the differential circuit has two transistors $T_2$ and $T_3$ attached by their emitters and not on their bases. This advantageous characteristic is permitted by the fact that the applied voltages are supplied by sources, namely resistances $R_5$ and $R_6$ particularly, with very low internal resistance. Continuous polarizations of the emitters are thus easy to create, in contrast with the case where the transistors would be attacked by their bases.

FIG. 4 represents a safety diagram or area and shows how the protective device according to the invention assures the maintenance of the representative points of the functioning of protected transistor $T_1$ on the inside of its contour.

In the Cartesian rectangular axes already described above, where the collector-emitter voltages are plotted on the abscissas and the collector currents on the ordinates, there is shown a "safety area" characteristic of a transistor. It is limited, on the one hand, by the axes of the coordinates, and, on the other hand, on the axes of the currents, by a maximum current horizontal lines AB, and on the axes of collector-emitter voltages, by a vertical line CD. Finally, contour BC is approximately an arc of a hyperbola with constant power.

The protective device according to the invention provides wherein the representative points of the functioning of the transistor $T_1$ in the following way. For a given maximum value $C'$ of the collector-emitter voltage, the base of the transistor is blocked and the collector current is zero. Points C and D of the usual safety area are merged at $C'$. For a decreasing value of the collector-emitter voltage the current permitted before destruction increases linearly. It is the portion of straight line $C'B'$, moreover comprising in practice a small curved part at $B'$ as soon as collector voltage $V_z + V_{BE}$, for which there is an almost vertical increase of the current, is reached. Finally, below this value of the collector voltage, there is a limitation to the value of current $I_M$, freely selected by adjustment of the characteristics of the supply source with constant current of the base of transistor $T_1$.

Thus, it is possible to establish that the use of the protective device according to the invention makes possible a functioning whose representative points can be made very close to the ideal external contour of the safety area.

It should be noted that the components which are part of this device lend themselves to a practical embodiment by direct integration, namely, for example, that of resistances $R_1$, $R_2$, $R_4$, $R_5$ and diodes $Z_1$ and $Z_2$.

This embodiment, besides the advantages of dimensions and cost, further comprises the advantage of assuring a maximum heat stability of the device, all the components with an important function being subjected to the same temperature variations. The invention has been described in the case of a transistor included in an integrated circuit; however, it is understood that a single transistor, isolated on a substrate, comes within the scope of the invention. Many other changes and modifications in the above described embodiment are, of course, possible without departing from the scope of the invention. Accordingly, that scope is intended to be limited only by the scope of the appended claims.

What is claimed is:

1. A protective device for a monolithic integrated transistor formed on a semi-conductive substrate of a first conductivity type and having a first collector region of a second conductivity opposite to said first conductivity formed on said substrate, a second base region of said first conductivity type formed on said first region, a third emitter region of said second conductivity type formed on said second region, and a fourth buried region of low resistivity and of said second type of conductivity between said collector region and said substrate, comprising:
    means for electrically connecting, through first and second wells of said high conductivity, to at least two separated points of said buried layer, thus defining inside this layer two resistive portions arranged in a two-resistor bridge, the common terminal of which being opposite to the emitter region, and the other terminals being said separated points;
    means connected to said connecting means for comparing the voltage between said points, and producing a control signal; and
    control means connected to said comparing and producing means and to said base region for controlling the base voltage as a function of said control signal, to thus protect said transistor against overload.

2. A protective device according to claim 1, wherein said one of said connecting means includes the terminal of said collector region of said transistor.

3. A protective device according to claim 1, wherein said one of said connecting means includes a terminal separate from said collector, emitter and base regions and connected to said buried layer.

4. A protective device according to claim 1, wherein said comparing means includes a differential circuit having a reference magnitude input and a regulating resistance for adjusting the reference magnitude input.

5. A protective device according to claim 4, wherein said differential circuit comprises two transistors each having a base, collector and emitter with said bases connected together, one of the collectors connected simultaneously to said bases and to said resistance, the other of the collectors being connected to the output of said differential circuit, adaption resistances connecting said emitters respectively to said points.

6. A protective device according to claim 5, including a Zener type diode connected in series with said regulating resistance.

7. A protective device according to claim 5, wherein at least some of said regulation and adaptation resistances are made by monolithic integration in said substrate.

8. A protective device according to claim 1, wherein said control means includes a regulating resistance for setting a control magnitude.

9. a protective device according to claim 1, wherein said control means includes a second transistor having base, collector, and emitter terminals with said base terminal connected to the output terminal of said comparing means, and the collector terminal connected to said base region to the base current of said integrated circuit transistor.

* * * * *